(12) United States Patent
Uehling et al.

(10) Patent No.: US 12,525,511 B2
(45) Date of Patent: Jan. 13, 2026

(54) SEMICONDUCTOR DEVICE WITH RESIN BLEED CONTROL STRUCTURE AND METHOD THEREFOR

(71) Applicant: NXP USA, INC., Austin, TX (US)

(72) Inventors: Trent Uehling, New Braunfels, TX (US); Wei Gao, Tianjin (CN); Chu-Chung Lee, Round Rock, TX (US)

(73) Assignee: NXP USA, INC., Austin, TX (US)

( * ) Notice: Subject to any disclaimer, the term of this patent is extended or adjusted under 35 U.S.C. 154(b) by 442 days.

(21) Appl. No.: 18/061,722

(22) Filed: Dec. 5, 2022

(65) Prior Publication Data

US 2024/0112989 A1 Apr. 4, 2024

(30) Foreign Application Priority Data

Sep. 29, 2022 (CN) .......................... 202211205210.5

(51) Int. Cl.
| | |
|---|---|
| H01L 23/495 | (2006.01) |
| H01L 21/48 | (2006.01) |
| H01L 21/56 | (2006.01) |
| H01L 23/00 | (2006.01) |
| H01L 23/31 | (2006.01) |

(52) U.S. Cl.
CPC .... *H01L 23/49513* (2013.01); *H01L 21/4842* (2013.01); *H01L 23/49565* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 21/56* (2013.01); *H01L 23/3107* (2013.01); *H01L 2224/2919* (2013.01); *H01L 2224/32257* (2013.01); *H01L 2224/45139* (2013.01); *H01L 2224/45144* (2013.01); *H01L 2224/45147* (2013.01); *H01L 2224/48091* (2013.01); *H01L 2224/48105* (2013.01); *H01L 2224/48245* (2013.01); *H01L 2224/48465* (2013.01); *H01L 2224/73265* (2013.01); *H01L 2224/92247* (2013.01); *H01L 2924/0665* (2013.01)

(58) Field of Classification Search
None
See application file for complete search history.

(56) References Cited

U.S. PATENT DOCUMENTS

| | | |
|---|---|---|
| 5,964,030 A | 10/1999 | Lee et al. |
| 6,940,182 B2 | 9/2005 | Hilton et al. |

(Continued)

FOREIGN PATENT DOCUMENTS

EP 0582084 A2 2/1994

*Primary Examiner* — Sue A Purvis
*Assistant Examiner* — Jordan M Klein

(57) ABSTRACT

A method of manufacturing a semiconductor device is provided. The method includes forming a package leadframe including a die pad, a first ridge formed at a first outer edge of the die pad, a second ridge formed at a second outer edge of the die pad opposite of the first outer edge and separate from the first ridge, and a plurality of leads surrounding the die pad. A semiconductor die is attached to the die pad by way of a die attach material. The semiconductor die is located on the die pad between the first ridge and the second ridge. An encapsulant encapsulates the semiconductor die and at least a portion of the package leadframe.

17 Claims, 6 Drawing Sheets

(56) References Cited

U.S. PATENT DOCUMENTS

| | | | | |
|---|---|---|---|---|
| 7,211,471 B1* | 5/2007 | Foster | ............... | H01L 23/49503 |
| | | | | 257/E23.037 |
| 2002/0084518 A1* | 7/2002 | Hasebe | ............... | H01L 23/3107 |
| | | | | 257/784 |
| 2002/0163015 A1* | 11/2002 | Lee | ......................... | H01L 24/32 |
| | | | | 257/E23.037 |
| 2002/0192874 A1* | 12/2002 | Schatzler | .......... | H01L 23/49517 |
| | | | | 257/E23.032 |
| 2006/0006510 A1* | 1/2006 | Koduri | .................... | H01L 24/49 |
| | | | | 257/E23.047 |
| 2009/0152691 A1* | 6/2009 | Nguyen | .................. | H01L 24/97 |
| | | | | 257/667 |
| 2022/0189856 A1 | 6/2022 | Chang et al. | | |

\* cited by examiner

SEMICONDUCTOR DEVICE WITH RESIN BLEED CONTROL STRUCTURE AND METHOD THEREFOR

CROSS-REFERENCE TO RELATED APPLICATIONS

This application claims the priority under 35 U.S.C. § 119 of China application no. 202211205210.5, filed on 29 Sep. 2022, the contents of which are incorporated by reference herein.

BACKGROUND

Field

This disclosure relates generally to semiconductor devices, and more specifically, to semiconductor device with resin bleed control structure and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a resin bleed control structure. The semiconductor device includes a semiconductor die mounted on a package leadframe having a plurality of conductive leads. The package leadframe includes a die pad surrounded by the plurality of conductive leads. The die pad of the leadframe is configured with a plurality of ridges formed at outer edges of the die pad. Each ridge is a structure (e.g., vertical wall) formed at each outer edge of the die pad during the stamping process of the leadframe, for example. Each ridge is configured to control resin bleed from a die attach material by preventing the resin bleed from reaching a backside of the die pad. By preventing the resin bleed from reaching the backside of the die pad in this manner, potential resin bleed contamination of manufacturing equipment is virtually eliminated. With the elimination of resin bleed contamination, superior product quality, higher production yields, and lower manufacturing costs can be realized.

Figure 1:
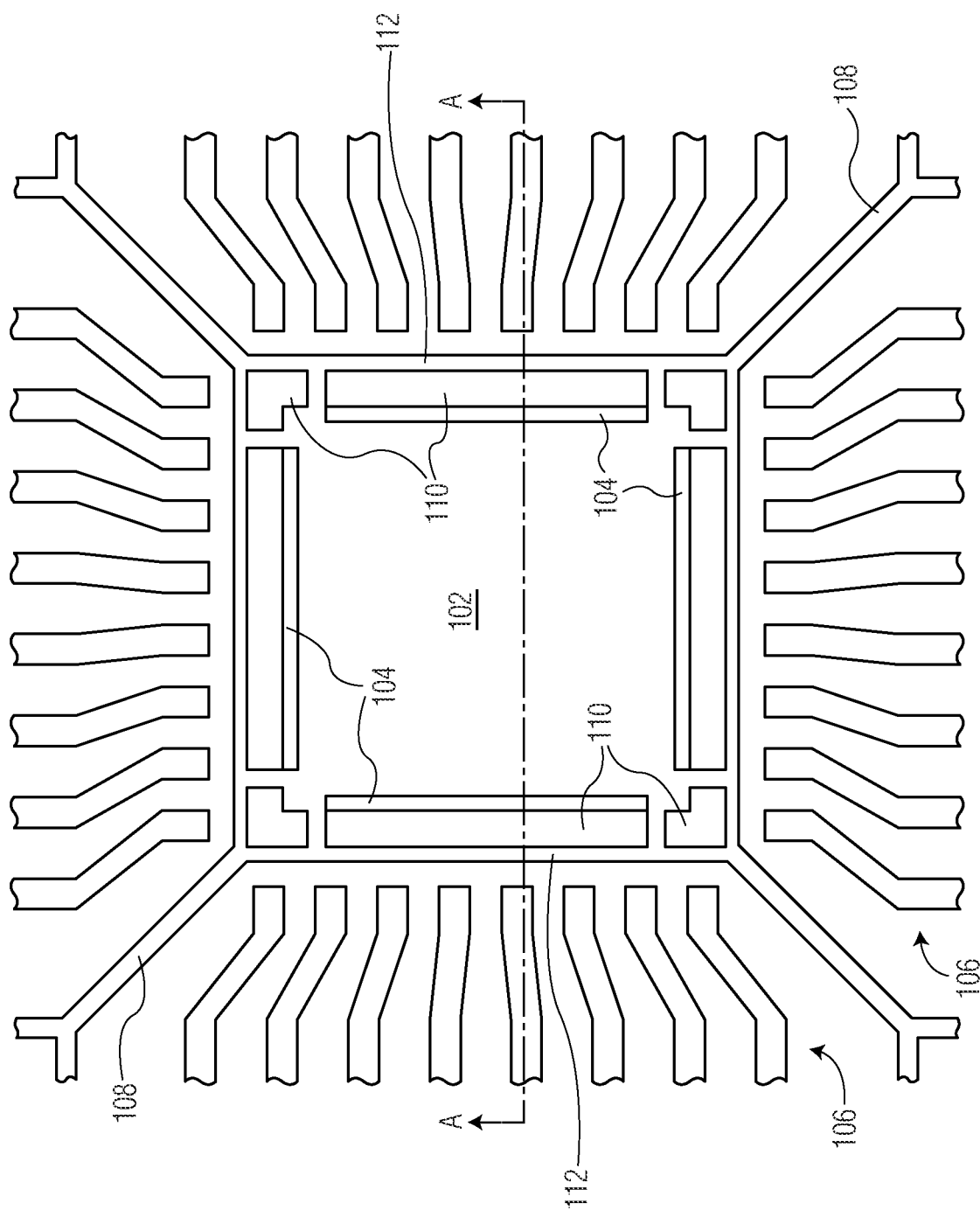
FIG. 1 illustrates, in a simplified plan view, an example semiconductor device package leadframe having resin bleed control structures at a stage of manufacture in accordance with an embodiment.

FIG. 1 illustrates, in a simplified plan view, an example semiconductor device package leadframe 100 having resin bleed control structures at a stage of manufacture in accordance with an embodiment. At this stage, the package leadframe 100 includes a die pad 102, a plurality of resin bleed control structures formed as ridges 104 at the outer edges of the die pad, a plurality of conductive leads 106 surrounding the die pad, tie bars 108, through openings 110 adjacent to outer edges of the plurality of ridges, and mold lock rails 112 connected to the tie bars and the die pad. In this embodiment, the plurality of ridges 104 is configured to arrest or impede resin bleed from a die attach material employed to attach a semiconductor die to the die pad 102.

In a conventional leadframe design, the die pad may be susceptible to resin bleed (e.g., from a die attach adhesive) contamination at the backside of the die pad. For example, the die attach material may "bleed" a resin material in a direction away from an attached die region toward the outer edges of the die pad. The resin bleed may eventually reach the backside of the die pad allowing the resin to contaminate handling equipment and subsequently contaminate other leadframes in a manufacturing flow. Such contamination may lead to reduced product quality and lower production yields. Design rules have been incorporated to mitigate contamination by keeping the attached die region further away from the die pad edges. With such design rules, however, leadframes with larger die pads are likely required. In turn, larger device packages may be needed to accommodate leadframes with larger die pads.

In the embodiment depicted in FIG. 1, the plurality of ridges 104 of the package leadframe 100 serve as resin bleed control structures by impeding resin bleed flow and thus, preventing resin bleed from reaching the backside of the die pad 102. By controlling the resin bleed by way of the die pad ridges 104, resin bleed contamination is eliminated without increasing die attach region to die edge design rules as may be required with conventional die pad designs. Accordingly, in this embodiment, the package leadframe 100 incorporates resin bleed control features (e.g., ridges 104) of the die pad 102 configured to prevent resin bleed contamination without significant impact to the size of the die pad 102 or overall size of the package leadframe 100.

The package leadframe 100 may be formed from suitable electrically conductive materials, such as copper, silver, nickel, aluminum, or iron, or alloys thereof, for example. The conductive metal may be bare, partially plated, or plated with another metal or an alloy such as iron/nickel alloy, silver, gold, copper, or the like. The term "conductive," as used herein, generally refers to electrical conductivity unless otherwise specified. Cross-sectional views of semiconductor device package leadframe 100 taken along line A-A are shown in example stages of manufacture depicted in FIG. 2 and FIG. 3.

The die pad 102 may be formed having any suitable shape or size. In this embodiment, each ridge 104 is formed at an outer edge of the die pad 102. A die attach region of the die pad 102 is essentially defined as a perimeter formed by the inner sidewalls of the ridges 104. Accordingly, the die attach region of the die pad is configured for an attachment of a semiconductor die such that the semiconductor die is substantially surrounded by the plurality of ridges 104. The plurality of leads 106 are configured and arranged to couple electrical signals between external (e.g., printed circuit board) locations of a mounted semiconductor device and internal locations such as bond pads on a semiconductor die attached to the die pad 102, for example. In this embodiment, through openings 110 are formed immediately adjacent to outer edges of the plurality of ridges. The openings 110 allow improved flow of a molding compound through the leadframe during a molding operation, for example. The mold lock rails 112 are formed at an outer perimeter of the openings 112 allowing the molding compound to further lock onto the leadframe as it cures.

Figure 2:
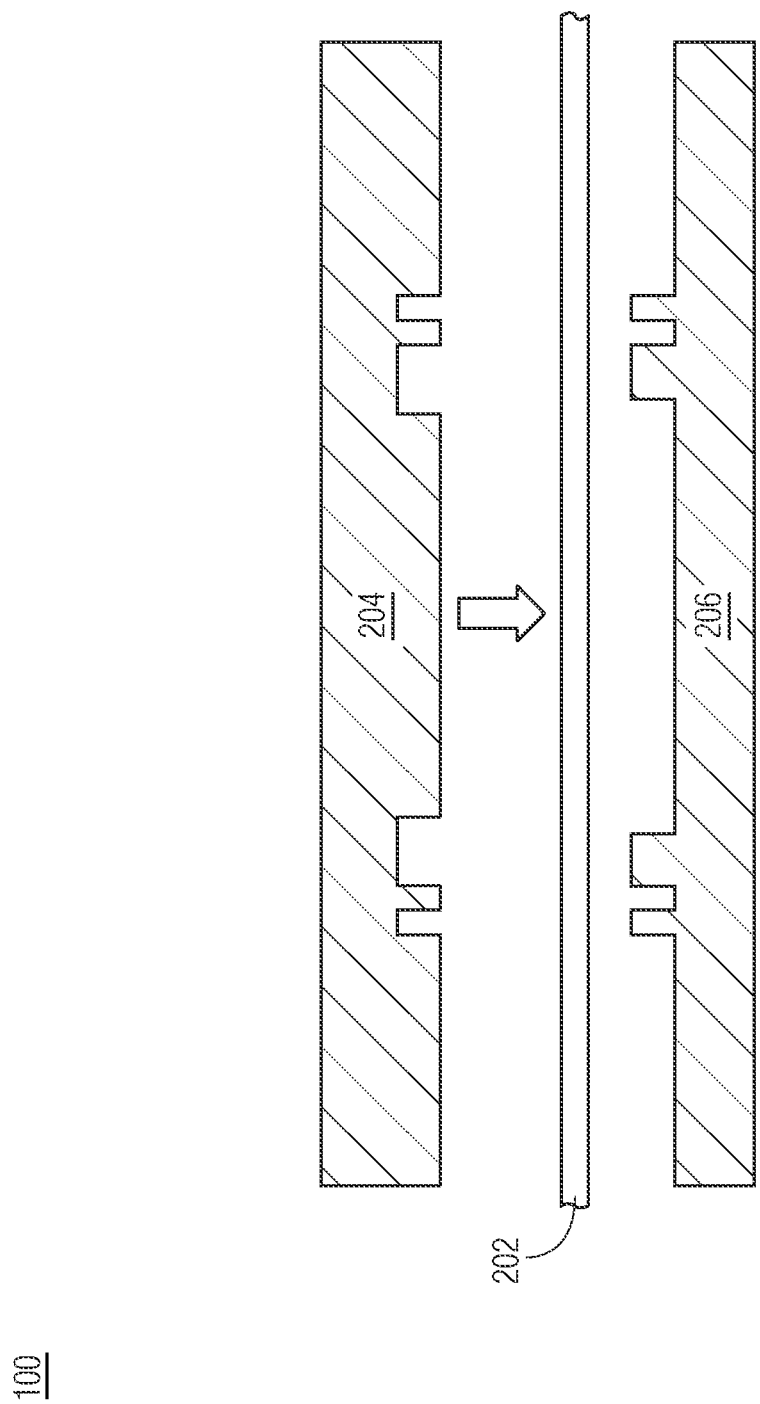
FIG. 2 and FIG. 3 illustrate, in simplified cross-sectional views, the example semiconductor device package leadframe at stages of manufacture in accordance with an embodiment.

FIG. 2 illustrates, in a simplified cross-sectional view, the example semiconductor device package leadframe 100 taken along line A-A at a stage of manufacture in accordance with an embodiment. At this stage, a leadframe blank 202 is positioned in a leadframe stamping apparatus. The leadframe blank 202 may be in the form of a metal sheet or metal strip which is fed into the stamping apparatus. The stamping apparatus may include a punch fixture 204 and a die fixture 206, for example, configured to punch out portions (e.g., openings 110, spaces between leads 106) of the metal and bend portions (e.g., ridges 104) of the metal to form features of the package leadframe 100 during a leadframe stamping operation.

Figure 3:
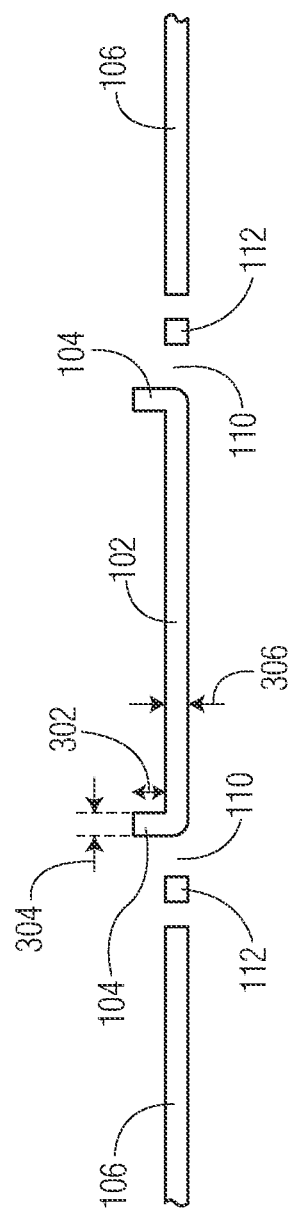

FIG. 3 illustrates, in a simplified cross-sectional view, the example semiconductor device package leadframe 100 taken along line A-A at a subsequent stage of manufacture in accordance with an embodiment. At this stage, the resulting package leadframe 100 from the stamping operation includes the die pad 102 and the ridges 104 formed at the outer edges, through openings 110 formed adjacent to outer edges of the ridges 104, mold lock rails 112 formed between the openings 110 and the conductive leads 106 surrounding the die pad. The package leadframe 100 may be bare, partially plated, or plated with another metal or alloy at this stage.

In this embodiment, the plurality of ridges 104 are formed by bending the die pad metal at the outer edges of the die pad 102 as a product of the leadframe stamping operation. For example, a ridge 104 is formed at each of the four major outer edges of the die pad 102 as a series of four separate ridge segments located around an outer edge perimeter of the die pad 102. In this embodiment, no ridge structure is formed in corners of the die pad 102. In this embodiment, each ridge 104 is formed as a vertical wall substantially perpendicular to the plane of the die pad 102. In some embodiment, each ridge 104 may be formed at an angle greater than 90 degrees relative to the plane of the die pad 102.

Each ridge 104 has a predetermined height dimension 302 measured from the plane at the top surface of the die pad 102 and a predetermined thickness dimension 304 based on the thickness 306 of the die pad 102. For example, the height dimension 302 may be in a range of 5-100 microns or higher, and the thickness dimension 304 may be in a range of 10-100% of the die pad thickness 306. In this embodiment, the height and thickness dimensions (302 and 304) are chosen for a ridge configuration to substantially arrest resin bleed which may occur from a die attach material used in a manufacture of a semiconductor device.

Figure 4:
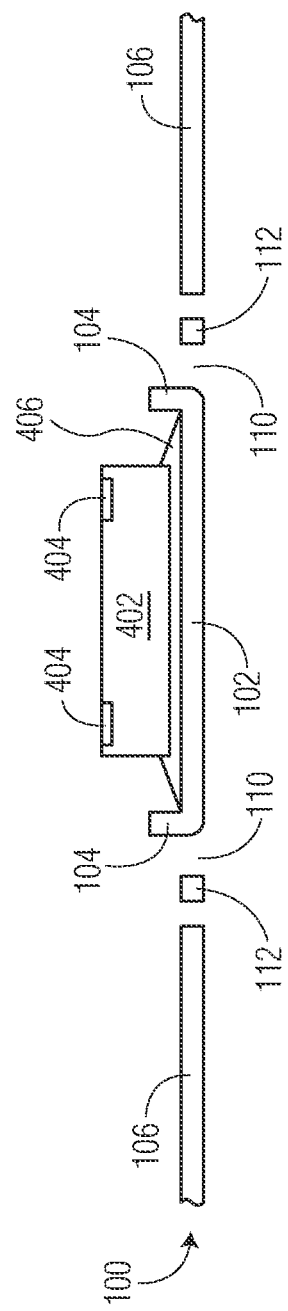
FIG. 4 through FIG. 6 illustrate, in simplified cross-sectional views, an example semiconductor device with the package leadframe having resin bleed control structures at stages of manufacture in accordance with an embodiment.
Figure 5:
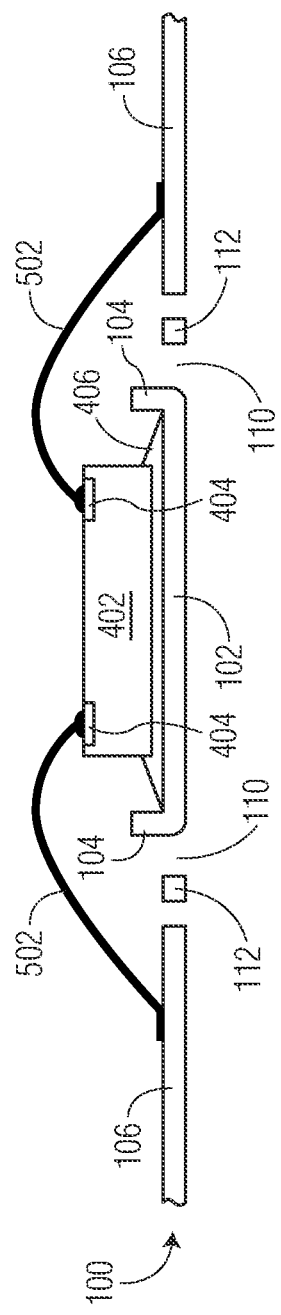
Figure 6:
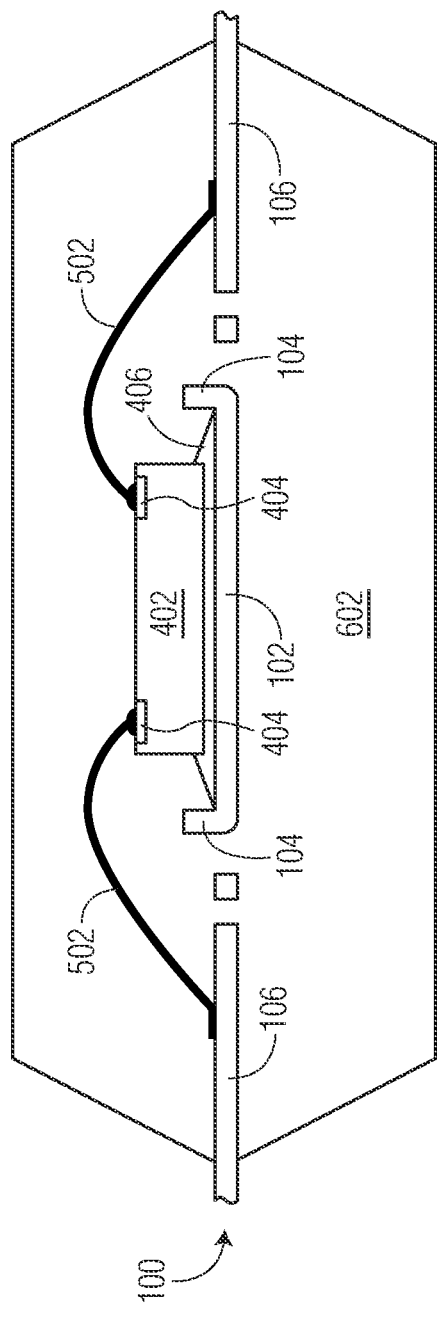

FIG. 4 through FIG. 6 illustrate, in simplified cross-sectional views, an example semiconductor device 400 at stages of manufacture in accordance with an embodiment. The stages of manufacture of the semiconductor device 400 depicted in FIG. 4 through FIG. 6 include the example package leadframe 100 taken along line A-A shown in FIG. 1.

FIG. 4 illustrates, in a simplified cross-sectional view, the example semiconductor device 400 taken along line A-A at a stage of manufacture in accordance with an embodiment. At this stage, a semiconductor die 402 is attached to the die pad 102 of the package leadframe 100. In this embodiment, the semiconductor die 402 is attached to the die pad 102 by way of a die attach material 406. The die attach material 406 may be an epoxy resin based adhesive material, for example. The ridges 104 are configured to substantially surround the attached semiconductor die 402 and block resin bleed from reaching the backside of the die pad 102. Accordingly, the formed ridges 104 at outer edges of the die pad 102 may be characterized as a resin bleed control structures.

The semiconductor die 402 has an active side (e.g., major side having circuitry, bond pads) and a backside (e.g., major side opposite of the active side). The semiconductor die 402 includes bond pads 404 located at the active side of the semiconductor die. The bond pads 404 may be configured for connection to respective leadframe leads 106 by way of bond wires (attached at a subsequent stage), for example. In this embodiment, semiconductor die 402 is configured in an active-side-up orientation. The semiconductor die 402 may be formed from any suitable semiconductor material, such as silicon, germanium, gallium arsenide, gallium nitride, and the like. The semiconductor die 402 may further include any digital circuits, analog circuits, RF circuits, memory, processor, the like, and combinations thereof at the active side.

FIG. 5 illustrates, in a simplified cross-sectional view, the example semiconductor device 400 taken along line A-A at a subsequent stage of manufacture in accordance with an embodiment. At this stage, the semiconductor device 400 includes bond wires 502 interconnecting the semiconductor die 402 with respective conductive leads 106 of the leadframe 100. In this embodiment, a ball bond is formed at respective bond pads 404 with a first end of the bond wire 502 and a wedge bond is formed on the corresponding conductive lead 106 with a second end of the bond wire 502. The bond wires 502 may be formed from a suitable metal material such as copper, silver, gold, or alloys thereof, for example.

FIG. 6 illustrates, in a simplified cross-sectional view, the example semiconductor device 400 taken along line A-A at a subsequent stage of manufacture in accordance with an embodiment. At this stage, the semiconductor device 400 includes an encapsulant 602 encapsulating the semiconductor die 402, the die pad 108 and ridges 104, and portions of the leads 106. The encapsulant 602 may be an epoxy molding compound dispensed during an injection molding encapsulation operation, for example. Portions of the leads 106 outside of the encapsulated region of the semiconductor device 400 are not shown for illustration purposes. At a subsequent stage of manufacture, the semiconductor device 400 may be singulated into individual devices with leads 106 trimmed and formed into a configuration suitable for attachment to a printed circuit board, for example.

Generally, there is provided, a method including forming a package leadframe, the package leadframe including a die pad including a first ridge formed at a first outer edge of the die pad; a second ridge formed at a second outer edge of the die pad opposite of the first outer edge, each of the first and second ridges separate from one another; a plurality of leads surrounding the die pad; attaching a semiconductor die to the die pad by way of a die attach material, the semiconductor die located between the first ridge and the second ridge; and encapsulating with an encapsulant the semiconductor die and at least a portion of the package leadframe. The method may further include before encapsulating with the encapsulant, attaching a first end of a bond wire to a bond pad of the semiconductor die and a second end of the bond wire to a lead of the plurality of leads. The first and second ridges may be formed from a same metal material as the die pad. The first and second ridges may be formed by bending the respective outer edges of the die pad such that the first and second ridges are substantially perpendicular to a plane of the die pad. The first and second ridges may be configured to arrest resin bleed from the die attach material. The package leadframe may further include an opening through the package leadframe immediately adjacent to an outer edge of each of the first and second ridges. The die pad may further include a third ridge formed at a third outer edge of the die pad, the third out edge different from the first and second outer edges; and a fourth ridge formed at a fourth outer edge of the die pad opposite of the third outer edge, each of the first, second, third, and fourth ridges separate from one another. The first and second ridges may be formed such that a top edge of the first and second ridges extends above the plane of the die pad by 5 microns or greater. The first and second ridges may be formed such that a thickness of each of the first and second ridges is in a range of 10% to 100% of the thickness of the die pad.

In another embodiment, there is provided, a semiconductor device including a package leadframe including a die pad and a plurality of leads, a plurality of ridges formed at outer edges of the die pad and configured to arrest resin bleed from a die attach material; a semiconductor die attached to the die pad of the package leadframe by way of the die attach material; a bond wire having a first end connected to a bond pad of the semiconductor die and a second end connected to a lead of the plurality of leads; and an encapsulant encapsulating the semiconductor die and at least a portion of the package leadframe. Each ridge of the plurality of ridges may be formed from a same metal material as the die pad. Each ridge of the plurality of ridges may be bent portion of the respective outer edges of the die pad such each ridge is substantially perpendicular to a plane of the die pad. The package leadframe may further include an opening through the package leadframe immediately adjacent to an outer edge of each ridge of the plurality of ridges. Each ridge of the plurality of ridges may be formed such that a top edge of each ridge extends above the plane of the die pad by 5 microns or greater. Each ridge of the plurality of ridges may be formed such that a thickness of each ridge is in a range of 10% to 100% of the thickness of the die pad.

In yet another embodiment, there is provided, a method including forming a package leadframe, the package leadframe including a die pad having a plurality of ridges formed at outer edges of the die pad, an opening through the package leadframe is adjacent to an outer edge of each ridge of the plurality of ridges; a plurality of leads surrounding the die pad; attaching a semiconductor die to the die pad by way of a die attach material, the semiconductor die substantially surrounded by the plurality of ridges; and encapsulating with an encapsulant the semiconductor die and at least a portion of the package leadframe. The method may further include before encapsulating with the encapsulant, attaching a first end of a bond wire to a bond pad of the semiconductor die and a second end of the bond wire to a lead of the plurality of leads. The plurality of ridges may be formed from a same metal material as the die pad. The plurality of ridges may be formed by bending respective outer edges of the die pad such that each ridge of the plurality of ridges is substantially perpendicular to a plane of the die pad. The plurality of ridges may be configured to arrest resin bleed from the die attach material.

By now it should be appreciated that there has been provided, a semiconductor device having a resin bleed control structure. The semiconductor device includes a semiconductor die mounted on a package leadframe having a plurality of conductive leads. The package leadframe includes a die pad surrounded by the plurality of conductive leads. The die pad of the leadframe is configured with a plurality of ridges formed at outer edges of the die pad. Each ridge is a structure (e.g., vertical wall) formed at each outer edge of the die pad during the stamping process of the leadframe, for example. Each ridge is configured to control resin bleed from a die attach material by preventing the resin bleed from reaching a backside of the die pad. By preventing the resin bleed from reaching the backside of the die pad in this manner, potential resin bleed contamination of manufacturing equipment is virtually eliminated. With the elimination of resin bleed contamination, superior product quality, higher production yields, and lower manufacturing costs can be realized.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method comprising:
   forming a package leadframe, the package leadframe including:
   a die pad including:
      a first ridge segment formed from a first bent portion of the die pad that forms a first vertical wall and that defines a first outer edge of the die pad,
      a second ridge segment formed from a second bent portion of the die pad that forms a second vertical and that defines a second outer edge of the die pad opposite of the first outer edge,
      a third ridge segment formed from a third bent portion of the die pad that forms a third vertical wall and that defines a third outer edge of the die pad, the third outer edge different from the first and second outer edges, and a fourth ridge segment formed from a fourth bent portion of the die pad that forms a fourth vertical wall and that defines a fourth outer edge of the die pad, the fourth outer edge different from the first, second, and third outer edges, wherein the first, second, third, and fourth ridge segments form a series of separate ridge segments such that no ridge structure is formed in corners of the die pad between adjacent ones of the first, second, third, and fourth ridge segments, a plurality of leads surrounding the die pad, an opening through the package leadframe immediately adjacent to an outer edge of the first ridge segment, and a mold lock rail within the opening and spaced apart from both the die pad and the plurality of leads;

attaching a semiconductor die to the die pad by way of a die attach material that extends to and contacts at least one of the four ridge segments, the semiconductor die located between the first ridge segment and the second ridge segment; and encapsulating with an encapsulant the semiconductor die and at least a portion of the package leadframe.

2. The method of claim 1, further comprising before encapsulating with the encapsulant, attaching a first end of a bond wire to a bond pad of the semiconductor die and a second end of the bond wire to a lead of the plurality of leads.

3. The method of claim 1, wherein the first and second ridge segments are formed from a same metal material as the die pad.

4. The method of claim 1, wherein the first, second, third, and fourth ridge segments are formed by bending the respective outer edges of the die pad such that the first, second, third, and fourth ridge segments are perpendicular to a plane of the die pad.

5. The method of claim 1, wherein the first, second, third, and fourth ridge segments are configured to arrest resin bleed from the die attach material.

6. The method of claim 1, wherein the first, second, third, and fourth ridge segments are formed such that a top edge of the first, second, third, and fourth ridge segments extends above the plane of the die pad by 5 microns or greater.

7. The method of claim 1, wherein the first, second, third, and fourth ridge segments are formed such that a thickness of each of the first, second, third, and fourth ridge segments is in a range of 10% to 100% of the thickness of the die pad.

8. A semiconductor device comprising:
a package leadframe including
a die pad,
a plurality of leads,
four ridge segments formed from four bent portions of the die pad at four outer edges of the die pad and configured to arrest resin bleed from a die attach material, wherein each of the four ridge segments forms one of four vertical walls that defines one of the four outer edges of the die pad, and wherein the four ridge segments form a series of separate ridge segments such that no ridge structure is formed in corners of the die pad between adjacent ones of the four ridge segments,
one or more openings through the package leadframe immediately adjacent to one or more of the four ridge segments, and a mold lock rail within the one or more openings and spaced apart from both the die pad and the plurality of leads;

a semiconductor die attached to the die pad of the package leadframe by way of the die attach material that extends to and contacts at least one of the four ridge segments;

a bond wire having a first end connected to a bond pad of the semiconductor die and a second end connected to a lead of the plurality of leads; and an encapsulant encapsulating the semiconductor die and at least a portion of the package leadframe.

9. The device of claim 8, wherein each ridge segment of the four ridge segments is formed from a same metal material as the die pad.

10. The device of claim 8, wherein each ridge segment of the four ridge segments is a different bent portion of the respective outer edges of the die pad such each ridge segment is perpendicular to a plane of the die pad.

11. The device of claim 8, wherein each ridge segment of the four ridge segments is formed such that a top edge of each ridge segment extends above the plane of the die pad by 5 microns or greater.

12. The device of claim 8, wherein each ridge segment of the four ridge segments is formed such that a thickness of each ridge segment is in a range of 10% to 100% of the thickness of the die pad.

13. A method comprising:
forming a package leadframe, the package leadframe including:
a die pad having:
four ridge segments formed from four bent portions of the die pad at four outer edges of the die pad, wherein each of the four ridge segments forms one of four vertical walls that defines one of the four outer edges of the die pad, wherein the four ridge segments form a series of separate ridge segments such that no ridge structure is formed in corners of the die pad between adjacent ones of the four ridge segments, and wherein an opening through the package leadframe is adjacent to an outer edge of each ridge of the plurality of ridges,
a plurality of leads surrounding the die pad, and
a mold lock rail within the opening and spaced apart from both the die pad and the plurality of leads;
attaching a semiconductor die to the die pad by way of a die attach material that extends to and contacts at least one of the four ridge segments, the semiconductor die surrounded by the four ridge segments; and
encapsulating with an encapsulant the semiconductor die and at least a portion of the package leadframe.

14. The method of claim 13, further comprising before encapsulating with the encapsulant, attaching a first end of a bond wire to a bond pad of the semiconductor die and a second end of the bond wire to a lead of the plurality of leads.

15. The method of claim 13, wherein the four ridge segments are formed from a same metal material as the die pad.

16. The method of claim 13, wherein the four ridge segments are formed by bending respective outer edges of the die pad such that each ridge segment of the four ridge segments is perpendicular to a plane of the die pad.

17. The method of claim 13, wherein four ridge segments are configured to arrest resin bleed from the die attach material.

* * * * *